United States Patent
Hong et al.

(10) Patent No.: US 11,994,561 B2
(45) Date of Patent: *May 28, 2024

(54) BATTERY CURRENT LIMITS ESTIMATION BASED ON RC MODEL

(71) Applicant: Karma Automotive LLC, Irvine, CA (US)

(72) Inventors: Jing Hong, Trabuco Canyon, CA (US); Suvrat Ramasubramanian, Costa Mesa, CA (US); Ali Jokar, Irvine, CA (US)

(73) Assignee: Karma Automotive LLC, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/327,991

(22) Filed: Jun. 2, 2023

(65) Prior Publication Data

US 2023/0314520 A1  Oct. 5, 2023

Related U.S. Application Data

(63) Continuation of application No. 17/821,253, filed on Aug. 22, 2022, now Pat. No. 11,698,414, which is a
(Continued)

(51) Int. Cl.
*G01R 31/382* (2019.01)
*G01R 31/374* (2019.01)
(Continued)

(52) U.S. Cl.
CPC ......... *G01R 31/382* (2019.01); *G01R 31/374* (2019.01); *G01R 31/389* (2019.01);
(Continued)

(58) Field of Classification Search
CPC .. G01R 31/382; G01R 31/374; G01R 31/392; H02J 7/005
(Continued)

(56) References Cited

U.S. PATENT DOCUMENTS

| 7,489,108 B2 | 2/2009 | Matsumoto et al. |
| 2005/0110498 A1 | 5/2005 | Plett |

(Continued)

FOREIGN PATENT DOCUMENTS

| CN | 104833922 A | 8/2015 |
| CN | 105301509 A | 2/2016 |

(Continued)

OTHER PUBLICATIONS

USPTO, Office Action relating to U.S. Appl. No. 16/788,796, dated Jan. 16, 2022.
(Continued)

*Primary Examiner* — Ricky Go
(74) *Attorney, Agent, or Firm* — Honigman LLP; Grant Griffith

(57) ABSTRACT

A method of estimating a battery current limit for operation of a battery cell over the course of a specified prediction time. The method includes generating a plurality of current limit estimations by means of a plurality of current limit estimation sub-methods, wherein at least one current limit estimation sub-method generates its current limit estimation based on an RC equivalent circuit model of the battery cell, and determining the charge current limit by finding the lowest magnitude current limit estimation in the plurality of current limit estimations. At least one parameter of the RC equivalent circuit model is set based on the specified prediction time and at least one variable from the set of: a state of charge (SOC) of the battery cell, a temperature of the battery cell, a state of health (SOH) of the battery cell, a capacity of the battery cell, and a current of the battery cell.

20 Claims, 5 Drawing Sheets

Related U.S. Application Data continuation of application No. 16/788,796, filed on Feb. 12, 2020, now Pat. No. 11,454,673.

(51) Int. Cl.
    *G01R 31/389*     (2019.01)
    *G01R 31/392*     (2019.01)
    *H02J 7/00*     (2006.01)

(52) U.S. Cl.
    CPC .......... *G01R 31/392* (2019.01); *H02J 7/0048* (2020.01); *H02J 7/005* (2020.01)

(58) Field of Classification Search
    USPC .......................................................... 702/63
    See application file for complete search history.

(56) References Cited

U.S. PATENT DOCUMENTS

| | | |
|---|---|---|
| 2006/0106553 A1 | 5/2006 | Melichar |
| 2006/0152196 A1 | 7/2006 | Matsumoto et al. |
| 2007/0145953 A1 | 6/2007 | Asai et al. |
| 2008/0094035 A1 | 4/2008 | Plett |
| 2010/0174500 A1 | 7/2010 | Plett |
| 2014/0184166 A1 | 7/2014 | Ohkawa et al. |
| 2015/0094971 A1 | 4/2015 | Boehm et al. |
| 2015/0326038 A1 | 11/2015 | Lee |
| 2016/0001672 A1 | 1/2016 | Lee |
| 2016/0131714 A1 | 5/2016 | Kuusisto et al. |
| 2017/0259684 A1 | 9/2017 | Lee |
| 2018/0198175 A1 | 7/2018 | Yamauchi et al. |
| 2018/0226824 A1 | 8/2018 | Sakabe et al. |
| 2019/0288347 A1* | 9/2019 | Yokoyama .............. B60L 50/60 |

FOREIGN PATENT DOCUMENTS

| | | | |
|---|---|---|---|
| DE | 102013000572 A1 | 7/2014 | |
| WO | WO-2007149289 A1 * | 12/2007 | ......... G01R 31/3648 |

OTHER PUBLICATIONS

USPTO. Office Action relating to U.S. Appl. No. 17/821,253, dated Jan. 5, 2023.

European Patent Office, Extended EP Search Report for Application 21754511.0 dated Feb. 16, 2024.

\* cited by examiner

BATTERY CURRENT LIMITS ESTIMATION BASED ON RC MODEL

CROSS REFERENCE TO PRIOR APPLICATIONS

This U.S. patent application is a continuation of, and claims priority under 35 U.S.C. § 120 from, U.S. patent application Ser. No. 17/821,253, filed on Feb. 12, 2020, which is a continuation of U.S. patent application Ser. No. 16/788,796, filed on Feb. 12, 2020. The disclosures of these prior applications are considered part of the disclosure of this application and are hereby incorporated by reference in their entireties.

TECHNICAL FIELD

The present disclosure relates to a battery current limit estimation method, wherein the method is based on an RC equivalent circuit model for a battery cell.

BACKGROUND

Li-ion batteries are used as the source of energy for many electrical systems, especially in hybrid electric vehicles (HEVs) and electric vehicles (EVs). In these vehicles, the battery interacts with other components by means of a Battery Management System (BMS) to provide power to the vehicle and meet the vehicle's energy demand, while maintaining the safety of the electrical system.

The reliability of these electrical systems is highly dependent on the health and safety of the battery, and therefore on the ability of the BMS to provide operational data that allows for peak performance without jeopardizing the health and safety of the battery. Controlling and monitoring a battery installed in an HEV or EV is impossible without a fast and accurate model of the battery to be used by the BMS. Li-ion battery models are used for estimating metrics of the battery, including state-of-charge (SOC), state-of-health (SOH), state-of-energy (SOE), and state-of-power (SOP). Also, the battery models are employed to help BMSs with the functions of battery control, real-time observation, parameter estimation, and optimization of the battery.

In all HEVs and EVs, it is necessary for the BMS to report the real-time power capability of the battery pack to the Hybrid Control Unit (HCU). The more accurate the estimation of the power capability of the battery pack, the more power the HCU can draw without risking damage to the system. In order to estimate the power capability, the SOP in the BMS should calculate the discharge and charge current limits of the battery based on the battery current, SOC, temperature, and SOH. These current limits are usually calculated for different time steps including but not limited to steps of 2s, 10s, and 30s.

To estimate the battery current limits, it is necessary to consult the cell discharge and charge current capabilities reported by the cell manufacturer. These current limits are determined by the manufacturer from a series of discharge and charge tests performed on the battery cell, with the tests being performed on a battery that is starting from a fully rested initial condition. However, in practice, batteries often operate with starting conditions other than a fully rested initial condition—for example, a user may restart their vehicle after only a 5-minute break to buy groceries. As such, the reported current limits based on a fully rested initial condition may be overestimations for many cases, especially in conditions of high and low working temperatures and aged battery cells.

To address this issue, it is necessary to have a model to calculate the battery current limits in different SOC, cell temperature, and SOH conditions. However, all presently available BMSs use a simplified structure to determine current limits or otherwise ignore different important parameters while calculating the battery pack current limits. This has caused inaccurate current limit calculation, especially in aged batteries, low-temperature conditions, and batteries with low SOC.

Conventional methods for calculating battery current limits are employed based on current limits tables provided by the cell manufacturer for different time steps. This method estimates the current limits based on the battery SOC and temperature. However, it does not consider the effects of the battery polarization level to estimate the current limits. Therefore, the method is not accurate in many cases, especially in low and high SOC and low temperature. To solve this problem, an interactive method based on a battery model is needed to calculate the battery polarization and consider it in determining the discharge and charge current limits.

SUMMARY

Disclosed herein is a method of estimating Li-ion battery current limits over the course of a specified prediction time by considering all cell limitations including but not limited to mechanical limits, charge conservation, kinetic limitation, and cell dynamic limitation. In one embodiment, the method determines the discharge current limit by finding a greatest discharge current limit from a set of discharge current limit estimations. In one embodiment, the method determines the charge current limit by finding a least charge current limit from a set of charge current limit estimations. In one embodiment, the discharge and charge current limit estimations are provided by a plurality of current limit estimation methods. In one embodiment, the plurality of current limit estimation methods includes (but is not limited to) a Hybrid Pulse Power Characterization (HPPC) method, a State of Charge (SOC) Limitation method, and an RC Model method. In one embodiment, the method employs an RC model for a battery cell to predict the voltage for the battery cell at a specific time in different SOC, temperature, current, voltage, and SOH conditions. In one embodiment, the method uses an RC model to find the discharge and charge current limit estimations based on a plurality of battery conditions, wherein the plurality of battery conditions includes state of charge, temperature, current, voltage, and state of health. In one embodiment, at least one of the plurality of current limit estimation methods uses the RC model. In one embodiment, the method uses a buffer function to consider all the above listed battery limitations for current limit calculation. In one embodiment, the method may be used by vehicles such as (but not limited to) electric vehicles, hybrid electric vehicles, and plug-in hybrid electric vehicles to calculate the peak current and/or the peak power of a battery pack installed in the vehicle.

Other aspects, features, and techniques will be apparent to one skilled in the relevant art in view of the following detailed description of the embodiments.

DESCRIPTION OF DRAWINGS

The features, objects, and advantages of the disclosed embodiments will become more apparent from the detailed description set forth below when taken in conjunction with the drawings in which like reference characters identify correspondingly throughout and wherein:

FIG. 3A is a block diagram of an exemplary embodiment of a discharge current limit estimation method. FIG. 3B is a block diagram of an exemplary embodiment of a charge current limit estimation method.

DETAILED DESCRIPTION

One aspect of the disclosure is directed to a peak power estimation method.

References throughout this document to "one embodiment," "certain embodiments," "an embodiment," or similar term mean that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. For example, two or more of the innovative methods described herein may be combined in a single method, but the application is not limited to the specific exemplary combinations of methods that are described herein.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

The character "N" refers hereinafter to the last member of a set or the total count of members in a set. The character "X" refers hereinafter to a variable member of a set. The characters "A", "B", "C", etc. refer to a specific but otherwise undefined member of a set.

A detailed description of various embodiments is provided; however, it is to be understood that the disclosed embodiments are merely exemplary and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the disclosed embodiments.

Figure 1:
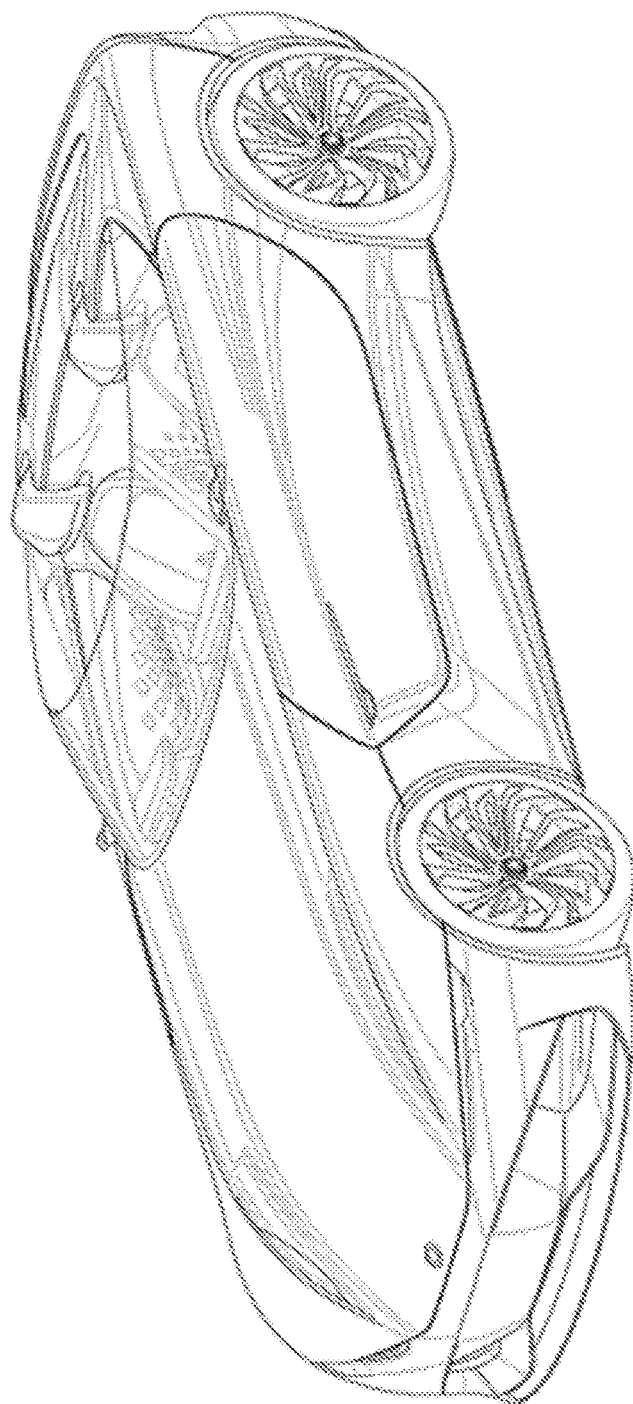
FIG. 1 is a perspective view of an exemplary embodiment of a vehicle including a battery pack with use for a peak power estimation method.

FIG. 1 is a perspective view of an exemplary embodiment of a vehicle 100, including a battery pack 200 with use for a current limit estimation method 300. The vehicle 100 shown in FIG. 1 is exemplary. The current limit estimation method 300 may be used with any vehicle, including a battery pack 200.

Figure 2:
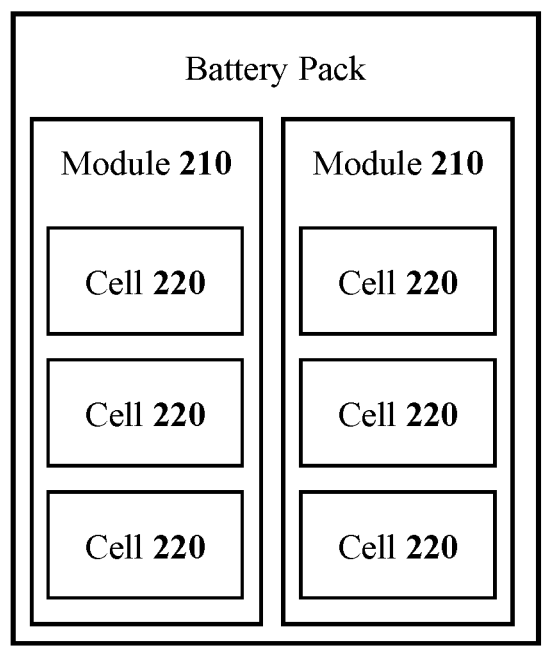
FIG. 2 is a block diagram of an exemplary embodiment of a battery pack with use for a peak power estimation method.

FIG. 2 is a block diagram of an exemplary embodiment of a battery pack 200 with use for a current limit estimation method 300. In one embodiment, the battery pack 200 includes a plurality of battery modules 210, and each battery module 210 may further include a plurality of battery cells 220. In one embodiment, the current limit estimation method 300 is applied on a per-cell basis. In another embodiment, the current limit estimation method 300 is applied on a per-module basis. In another embodiment, the current limit estimation method 300 is applied on a battery pack 200 basis.

Figure 3A:
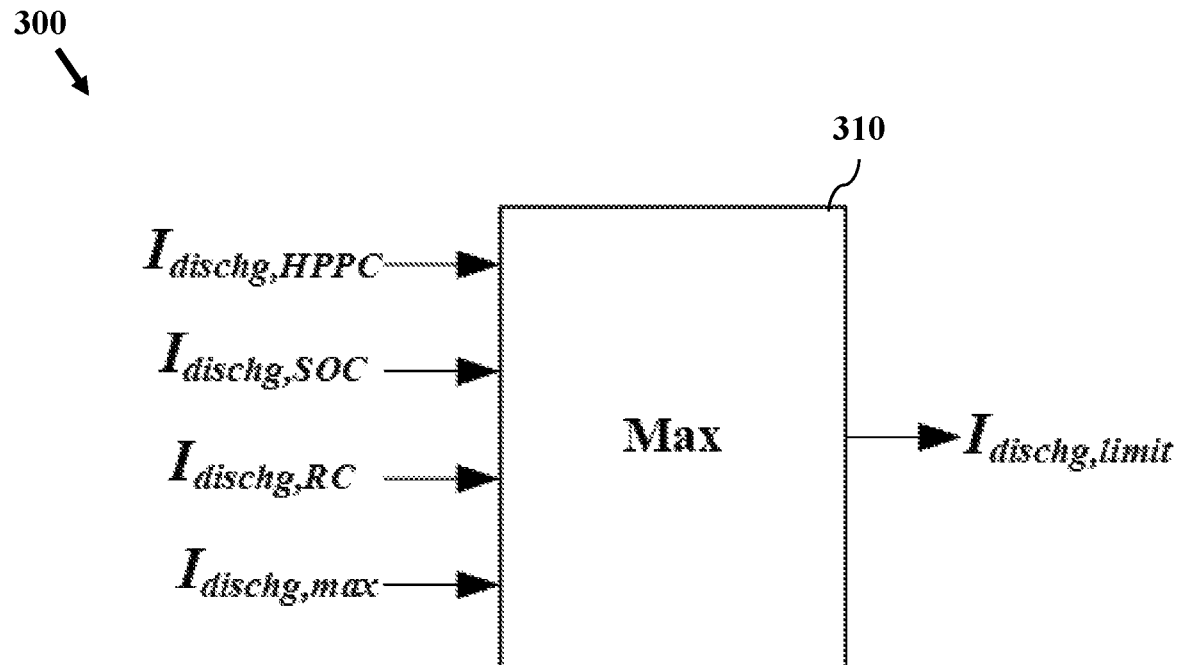
FIGS. 3A and 3B are block diagrams of an exemplary embodiment of a current limit estimation method.
Figure 3B:
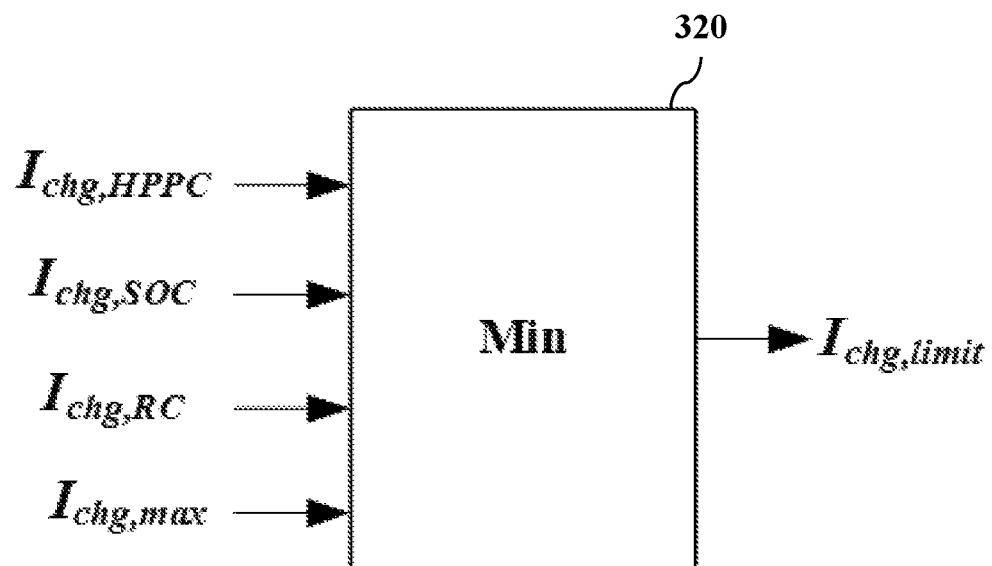

FIGS. 3A and 3B are block diagrams of an exemplary embodiment of a current limit estimation method 300. FIG. 3A is a block diagram of an exemplary embodiment of a discharge current limit estimation method 310. In one embodiment, the discharge current limit estimation method 310 finds a maximum estimated discharge limit value $I_{dischg,limit}$ (wherein $I_{dischg}<0$) from a set of at least three $I_{dischg}$ estimated discharge limits determined by separate estimation methods. In one embodiment, the discharge current limit estimation method 310 further limits the value of $I_{dischg,limit}$ by means of an $I_{dischg,max}$ value set by the designer, such that $I_{dischg,limit} \geq I_{dischg,max}$. FIG. 3B is a block diagram of an exemplary embodiment of a charge current limit estimation method 320. In one embodiment, the charge current limit estimation method 320 finds a minimum estimated charge limit value $I_{chg,limit}$ (wherein $I_{chg}>0$) from a set of at least three $I_{chg}$ estimated charge limits determined by separate estimation methods. In one embodiment, the charge current limit estimation method 320 further limits the value of $I_{chg,limit}$ by means of an $I_{chg,max}$ value set by the designer, such that $I_{chg,limit} \leq I_{chg,max}$.

Figure 4:
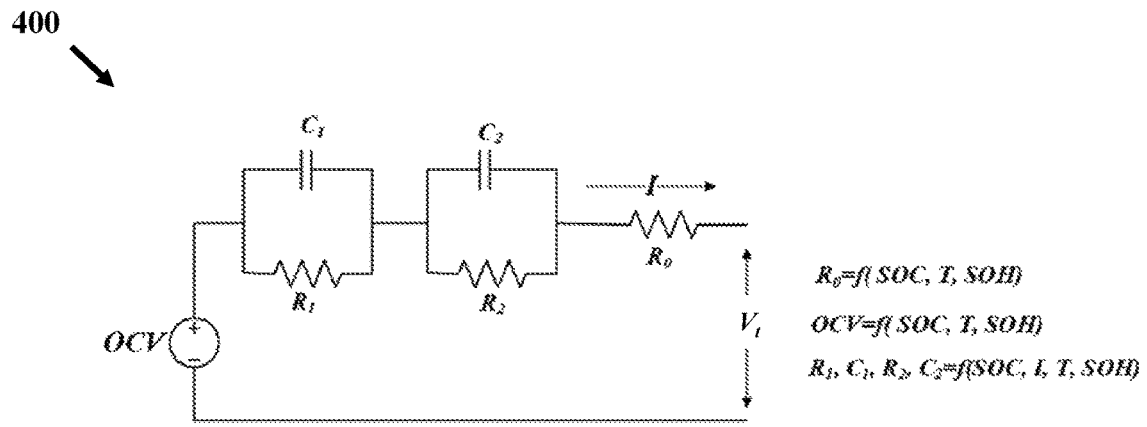
FIG. 4 is a circuit diagram of an exemplary embodiment of a two branches RC model equivalent circuit for a battery cell.

FIG. 4 is a circuit diagram of an exemplary embodiment of a two branches RC model equivalent circuit 400 for a battery cell 220. In several embodiments of the various estimation methods collated in the current limit estimation method 300, parameters of the RC model 400 are estimated based on experimental data from different cell tests. In one embodiment, the parameters of the RC model 400 include the open circuit voltage OCV (the electric potential of the battery cell 220 when the cell's terminals are not connected), resistance parameters $R_0$, $R_1$, and $R_2$, capacitance parameters $C_1$ and $C_2$, and the terminal voltage $V_t$. In one embodiment, the parameters of the RC model 400 are determined as functions of at least one of the following parameters: state of charge SOC, current I, temperature $T_{Cell}$, and state of health SOH.

Figure 5:
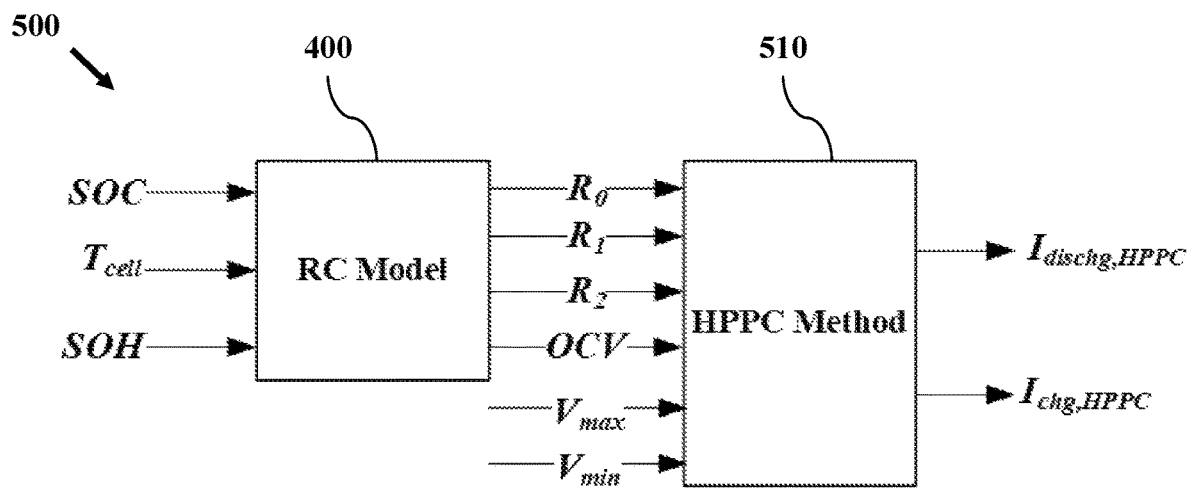
FIG. 5 is a block diagram of an exemplary embodiment of an HPPC current limit estimation method.

FIG. 5 is a block diagram of an exemplary embodiment of an HPPC current limit estimation method 500. In one embodiment, the HPPC current limit estimation method 500 calculates the maximum discharge/charge current estimates $I_{dischg,HPPC}$ and $I_{chg,HPPC}$ based on the battery internal resistance $R_0$, $R_1$, and $R_2$ at each condition. In one embodiment, the method 500 assumes the final cell voltage will be a minimum allowable battery cell voltage $V_{min}$ after discharging the cell by the maximum discharge current $I_{dischg,HPPC}$ for a given prediction time, wherein $V_{min}$ is a battery parameter provided by the manufacturer. In one embodiment, for the charging process, the method 500 also assumes the final cell voltage will be a maximum allowable battery cell voltage $V_{max}$ after charging the cell 220 by the maximum charge current $I_{chg,HPPC}$ for a given prediction time, wherein $V_{max}$ is a battery parameter provided by the manufacturer. Then, the maximum discharge and charge currents $I_{dischg,HPPC}$ and $I_{chg}$,HPPC are estimated by using the internal resistance as determined at the present time, as follows:

$$I_{dischg,HPPC} = \frac{V_{min} - OCV}{R_0 + R_1 + R_2}$$

$$I_{chg,HPPC} = \frac{V_{max} - OCV}{R_0 + R_1 + R_2}$$

Figure 6:
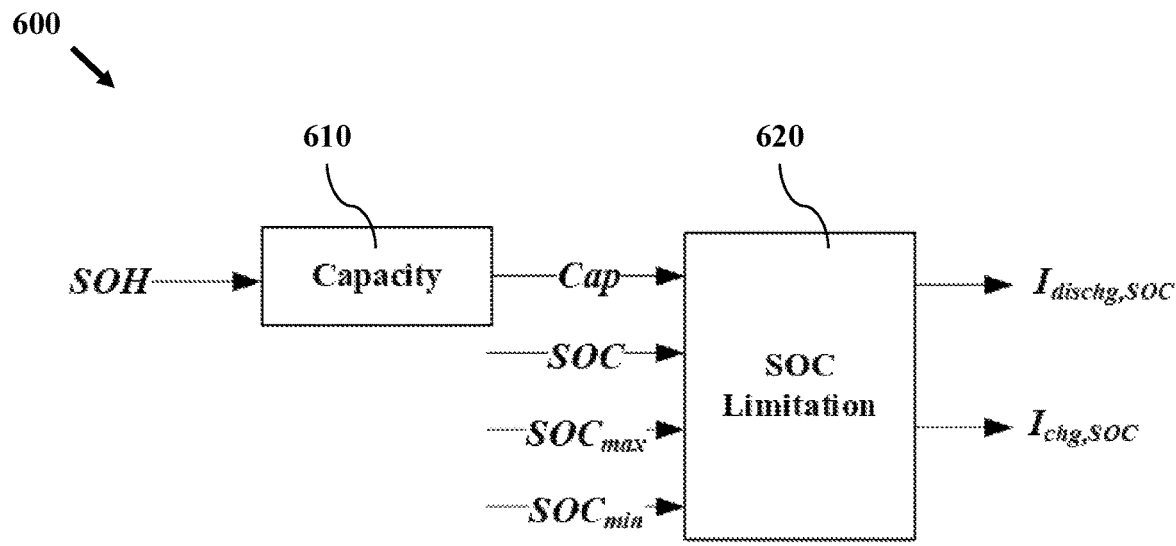
FIG. 6 is a block diagram of an exemplary embodiment of an SOC Limitation current limit estimation method.

FIG. 6 is a block diagram of an exemplary embodiment of a SOC Limitation current limit estimation method 600. In one embodiment, the method 600 calculates the maximum discharge/charge current estimates $I_{dischg,SOC}$ and $I_{chg,SOC}$ by using a version of the current integration method, otherwise known as the Coulomb counting method. In one embodiment, the final SOC is considered to be $SOC_{min}$ after discharging the battery cell 220 by the maximum discharge current $I_{dischg,soc}$ for a given prediction time, wherein $SOC_{min}$ is a predefined value marking the point at which the battery cell 220 is considered to be empty. Likewise, in one embodiment, the final SOC is considered to be $SOC_{max}$ after charging the battery cell 220 by the maximum charge current $I_{chg,SOC}$ for a given prediction time, wherein $SOC_{max}$ is a predefined value marking the point at which the battery cell 220 is considered to be fully charged. Then, in one embodiment, the maximum discharge and charge currents $I_{dischg,SOC}$ and $I_{chg,SOC}$ will be estimated based on battery cell 220 capacity, as follows:

$$I_{dischg,SOC} = \frac{(SOC_{min} - SOC_0) \times \text{Capacity}}{t_K}$$

$$I_{chg,SOC} = \frac{(SOC_{max} - SOC_0) \times \text{Capacity}}{t_K}$$

In one embodiment, the capacity block 610 determines a capacity of the battery cell 220 based on the state of health (SOH) of the battery cell 220. In one embodiment, the capacity is defined as the usable capacity of the battery cell 220 at 25° C. with 1C constant discharge rate and a given SOH value, with usable capacity measured from a full charge to a minimum charge defined by a cut-off voltage. Therefore, in one embodiment, the estimates will update at the SOC Limitation calculation block 620 based on the SOH value on the capacity block 610.

Figure 7:
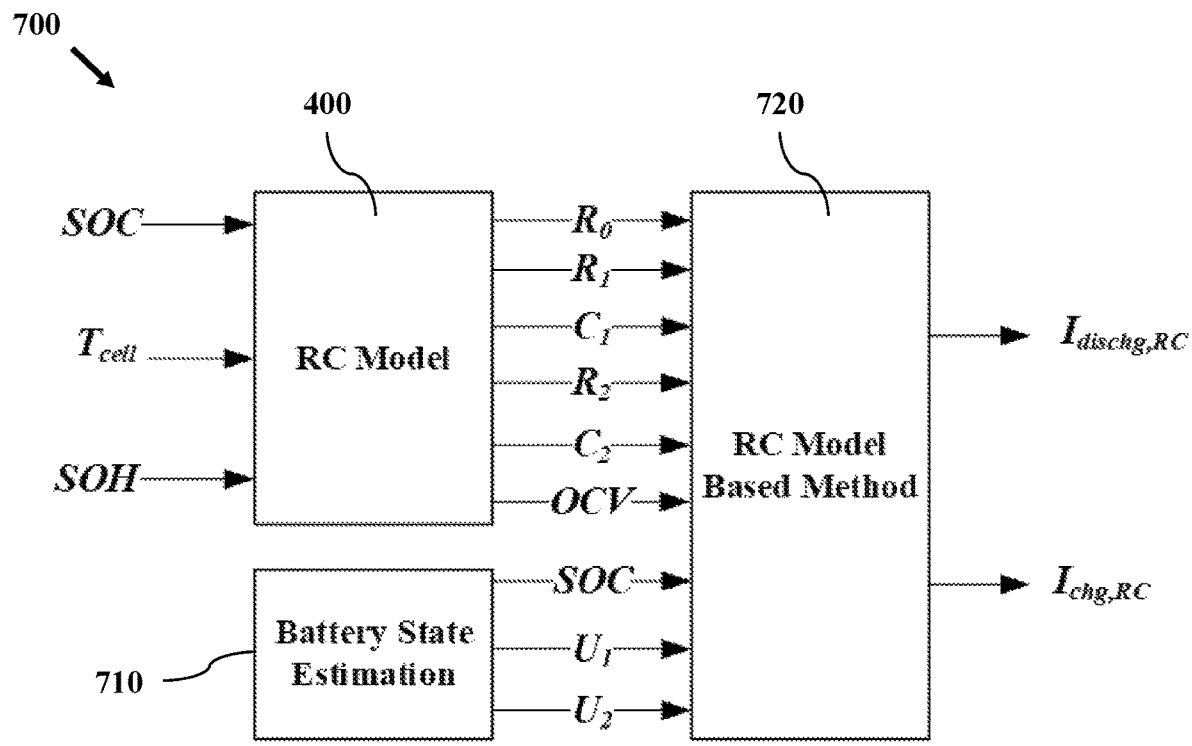
FIG. 7 is a block diagram of an exemplary embodiment of an RC model current limit estimation method.

FIG. 7 is a block diagram of an exemplary embodiment of an RC model current limit estimation method 700. In one embodiment, the method 700 predicts the discharge and charge current limits $I_{dischg,RC}$ and $I_{chg,RC}$ by using the RC model 400. In one embodiment, by using this RC model 400, the cell terminal voltage ($V_t$) can be calculated as follows, $$V_{t,k} = OCV_k + I_k \times R_{0,k} + U_{1,k-1} e^{-\Delta t/(R_1 C_1)} +$$
$$I_k \times R_{1,k}\left(1 - e^{-\Delta t/(R_1 C_1)}\right) + U_{2,k-1} e^{-\Delta t/(R_2 C_2)} + I_k \times R_{2,k}\left(1 - e^{-\Delta t/(R_2 C_2)}\right)$$

and the cell voltage $I_k$ can be calculated as follows, $$I_k = \frac{V_{t,k} - OCV_k - U_{1,k-1} e^{-\Delta t/(R_1 C_1)} - U_{2,k-1} e^{-\Delta t/(R_2 C_2)}}{R_{0,k} + R_{1,k}\left(1 - e^{-\Delta t/(R_1 C_1)}\right) + R_{2,k}\left(1 - e^{-\Delta t/(R_2 C_2)}\right)}$$

where and $U_{1,k-1}$ are $U_{2,k-1}$ the voltages across the first branch and the second branch of the RC model 400, $\Delta t$ is the incremental sampling period of the battery cell 220 measurement, k is the sampling step number, K is the number of sampling steps taken (such that $1 \leq k \leq K$ and $K\Delta t = t_K$), and $V_t$ is considered as $V_{min}$ for discharge current limit calculations and $V_{max}$ for charge current limit calculations. In order to predict the discharge and charge current limits $I_{dischg,RC}$ and $I_{chg,RC}$ over the course of multiple seconds, it is necessary to discretize the equation by performing the calculation in multiple steps with several smaller $\Delta t$ increments to find the results over the full prediction time $t_K$.

While this disclosure makes reference to exemplary embodiments, it will be understood by those skilled in the art that various changes in form and details may be made therein without departing from the scope of the claimed embodiments.

What is claimed is:

1. A vehicle comprising:
   a battery cell configured to power the vehicle; and
   a battery management system in communication with the battery cell, the battery management system configured to:
   generate a first discharge current limit estimation for operating the battery cell over a prediction time;
   generate a second discharge current limit estimation for operating the battery cell over the prediction time; and
   operate the battery cell to power the vehicle using the one of the first discharge current limit estimation or the second discharge current limit estimation associated with a lowest magnitude.

2. The vehicle of claim 1, wherein the battery management system is configured to generate at least one of the first discharge current limit estimation or the second discharge current limit estimation based on an RC equivalent circuit model of the battery cell.

3. The vehicle of claim 2, wherein at least one parameter of the RC equivalent circuit model is set based on the prediction time and at least one of a state of charge (SOC) of the battery cell, a temperature of the battery cell, a state of health (SOH) of the battery cell, a capacity of the battery cell, or a current of the battery cell.

4. The vehicle of claim 1, wherein the battery management system is configured to:
   generate the first discharge current limit estimation using one of a Hybrid Pulse Power Characterization (HPPC) method or a State of Charge (SOC) Limitation method; and
   generate the second discharge current limit estimation using another one of the HPPC method or the SOC Limitation method.

5. The vehicle of claim 4, wherein the HPPC method generates the first discharge current limit estimation or the second discharge current limit estimation based on an internal resistance of the battery cell as modeled by an RC equivalent circuit model of the battery cell.

6. The vehicle of claim 1, wherein the battery management system is configured to:
   generate the first discharge current limit estimation using one of a Hybrid Pulse Power Characterization (HPPC) method or an RC Model method; and generate the second discharge current limit estimation using another one of the HPPC method or the RC Model method.

7. The vehicle of claim 1, wherein the battery management system is configured to:
generate the first discharge current limit estimation using one of an RC Model method or a State of Charge (SOC) Limitation method; and
generate the second discharge current limit estimation using another one of the RC Model method or the SOC Limitation method.

8. The vehicle of claim 1, wherein the battery management system is configured to generate the first discharge current limit estimation using an RC Model method.

9. The vehicle of claim 8, wherein the RC Model method generates the first discharge current limit estimation by using parameters of an RC equivalent circuit model of the battery cell to find the first discharge current limit estimation according to the following equation:

$$I_k = \frac{V_{t,k} - OCV_k - U_{1,k-1}e^{-\Delta t/(R_1 C_1)} - U_{2,k-1}e^{-\Delta t/(R_2 C_2)}}{R_{0,k} + R_{1,k}\left(1 - e^{-\Delta t/(R_1 C_1)}\right) + R_{2,k}\left(1 - e^{-\Delta t/(R_2 C_2)}\right)}$$

where and $U_{2,k-1}$ are $U_{2,k-1}$ voltages across a first branch and a second branch of the RC equivalent model, $\Delta t$ is an incremental sampling period of the battery cell measurement, k is a sampling step number, K is a number of sampling steps taken (such that $1 \leq k \leq K$ and $K\Delta t = t_k$), $I_k$ is the first discharge current limit estimation, and $V_t$ is a final voltage after the prediction time has elapsed.

10. The vehicle of claim 9, wherein the final voltage comprises a minimum allowable battery cell voltage $V_{min}$.

11. A vehicle comprising:
a battery cell configured to power the vehicle; and
a battery management system in communication with the battery cell, the battery management system configured to:
generate a first charge current limit estimation for operating the battery cell over a prediction time;
generate a second charge current limit estimation for operating the battery cell over the prediction time; and
operate the battery cell to power the vehicle using the one of the first charge current limit estimation or the second charge current limit estimation associated with a lowest magnitude.

12. The vehicle of claim 11, wherein the battery management system is configured to generate at least one of the first charge current limit estimation or the second charge current limit estimation based on an RC equivalent circuit model of the battery cell.

13. The vehicle of claim 12, wherein at least one parameter of the RC equivalent circuit model is set based on the prediction time and at least one of a state of charge (SOC) of the battery cell, a temperature of the battery cell, a state of health (SOH) of the battery cell, a capacity of the battery cell, or a current of the battery cell.

14. The vehicle of claim 11, wherein the battery management system is configured to:
generate the first charge current limit estimation using one of a Hybrid Pulse Power Characterization (HPPC) method or a State of Charge (SOC) Limitation method; and
generate the second charge current limit estimation using another one of the HPPC method or the SOC Limitation method.

15. The vehicle of claim 14, wherein the HPPC method generates the first charge current limit estimation or the second charge current limit estimation based on an internal resistance of the battery cell as modeled by an RC equivalent circuit model of the battery cell.

16. The vehicle of claim 11, wherein the battery management system is configured to:
generate the first charge current limit estimation using one of a Hybrid Pulse Power Characterization (HPPC) method or an RC Model method; and
generate the second charge current limit estimation using another one of the HPPC method or the RC Model method.

17. The vehicle of claim 11, wherein the battery management system is configured to:
generate the first charge current limit estimation using one of an RC Model method or a State of Charge (SOC) Limitation method; and
generate the second charge current limit estimation using another one of the RC Model method or the SOC Limitation method.

18. The vehicle of claim 11, wherein the battery management system is configured to generate the first charge current limit estimation using an RC Model method.

19. The vehicle of claim 18, wherein the RC Model method generates the first charge current limit estimation by using parameters of an RC equivalent circuit model of the battery cell to find the first charge current limit estimation according to the following equation:

$$I_k = \frac{V_{t,k} - OCV_k - U_{1,k-1}e^{-\Delta t/(R_1 C_1)} - U_{2,k-1}e^{-\Delta t/(R_2 C_2)}}{R_{0,k} + R_{1,k}\left(1 - e^{-\Delta t/(R_1 C_1)}\right) + R_{2,k}\left(1 - e^{-\Delta t/(R_2 C_2)}\right)}$$

where $U_{1,k-1}$ and $U_{2,k-1}$ are voltages across a first branch and a second branch of the RC equivalent model, $\Delta t$ is an incremental sampling period of the battery cell measurement, k is a sampling step number, K is a number of sampling steps taken (such that $1 \leq k \leq K$ and $K\Delta t = t_k$), $I_k$ is the first discharge current limit estimation, and $V_t$ is a final voltage after the prediction time has elapsed.

20. The vehicle of claim 19, wherein the final voltage comprises a maximum allowable battery cell voltage $V_{max}$.

* * * * *